(12) United States Patent
Lee et al.

(10) Patent No.: US 8,513,061 B2
(45) Date of Patent: Aug. 20, 2013

(54) METHOD OF FABRICATING A TSV FOR 3D PACKAGING OF SEMICONDUCTOR DEVICE

(75) Inventors: Jae-Hak Lee, Daejeon (KR);
 Chang-Woo Lee, Daejeon (KR);
 Joon-Yub Song, Daejeon (KR); Tae-Ho Ha, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 290 days.

(21) Appl. No.: 13/031,861

(22) Filed: Feb. 22, 2011

(65) Prior Publication Data

US 2012/0153496 A1 Jun. 21, 2012

(30) Foreign Application Priority Data

Dec. 21, 2010 (KR) ........................ 10-2010-0131906

(51) Int. Cl.
 *H01L 21/00* (2006.01)
 *H01L 23/48* (2006.01)
(52) U.S. Cl.
 USPC ........... 438/118; 438/667; 438/678; 257/774; 257/783; 257/E21.577; 257/E23.011; 257/E23.145
(58) Field of Classification Search
 None
 See application file for complete search history.

(56) References Cited

U.S. PATENT DOCUMENTS

| 7,973,411 | B2* | 7/2011 | Borthakur | 257/762 |
|---|---|---|---|---|
| 2007/0108489 | A1* | 5/2007 | Nagai | 257/295 |
| 2007/0284729 | A1* | 12/2007 | Kwon et al. | 257/700 |
| 2008/0230912 | A1* | 9/2008 | Lee et al. | 257/758 |
| 2009/0023243 | A1* | 1/2009 | Koyanagi | 438/107 |
| 2010/0224977 | A1* | 9/2010 | Kim | 257/686 |
| 2011/0133333 | A1* | 6/2011 | Kwon et al. | 257/737 |
| 2011/0147946 | A1* | 6/2011 | Lee et al. | 257/774 |
| 2012/0028412 | A1* | 2/2012 | Jeong et al. | 438/107 |

* cited by examiner

*Primary Examiner* — Alonzo Chambliss
(74) *Attorney, Agent, or Firm* — Lexyoume IP Meister, PLLC.

(57) ABSTRACT

The present invention relates to a through silicon via (TSV) for 3D packaging to integrate a semiconductor device and a method for manufacturing the same, and more particularly, to a through silicon via (TSV) for 3D packaging of a semiconductor device that is capable of improving production efficiency, having very high electric conductivity, and minimizing electrical signal delay, without using a carrier wafer by self-aligning substrates in a low temperature state and sequentially bonding a plurality of semiconductor dies (or semiconductor chips), and a method of manufacturing the same.

9 Claims, 12 Drawing Sheets

METHOD OF FABRICATING A TSV FOR 3D PACKAGING OF SEMICONDUCTOR DEVICE

CROSS-REFERENCE TO RELATED APPLICATIONS

This application claims priority to and the benefit of Korean Patent Application No. 10-2010-0131906, filed in the Korean Intellectual Property Office on Dec. 21, 2010, the entire content of which is incorporated herein by reference.

BACKGROUND OF THE INVENTION (a) Field of the Invention

The present invention relates to a through silicon via (TSV) for 3D packaging to integrate a semiconductor device and a method for manufacturing the same, and more particularly, to a through silicon via (TSV) for 3D packaging of a semiconductor device that is capable of improving production efficiency, having very high electrical conductivity, and minimizing electrical signal delay without using a carrier wafer by self-aligning substrates in a low temperature state and sequentially bonding a plurality of semiconductor dies (or semiconductor chips), and a method of manufacturing the same.

(b) Description of the Related Art

Electronic package technology is very broad, and includes various system manufacturing technologies including all the processes from a semiconductor device to a final product. In particular, with the rapid development of electronic products, electronic package technology is a very important for achieving compactness, lightness, and high performance of devices.

Electronic package technology is also a very important technology for determining performance, size, price, reliability, etc., of final electronic products. In particular, in recent electronic products pursuing high electrical performance, subminiature/high density, low power, multi-function, ultrahigh speed signal processing, and permanent reliability, the subminiature package parts are needed as essential parts for computers, information communication devices, mobile communication devices, premium home appliances, etc.

An example of a representative technology of three-dimensionally stacking semiconductor devices including chips to connect the semiconductor devices or mount the semiconductor devices on a substrate may include wire bonding technology, flip chip technology, and through silicon via (TSV) technology.

Wire bonding technology, which is a technology of attaching and connecting a wire to a metal pad of a connection part using an ultrasonic tool, is inexpensive in view of manufacturing costs but has a limitation in connecting fine pitches and high-density electrodes due to the bonding between the wire and the metal pad, and cannot be used for parts requiring ultrahigh speed signal processing due to an increase in parasitic inductance according to an increase in the length of the signal line for electrically connecting between the connection parts.

The flip chip technology is largely divided into two, i.e., a solder flip chip using solder and a non-solder flip chip not using solder. The solder flip chip has problems in that production cost is increased due to a very complicated connection process such as solder flux application, chip/substrate alignment, solder bump reflow, flux removal, underfill filling, curing, etc. Therefore, recently, the non-solder flip chip technology has gained a large amount of interest in order to reduce the number of complicated processes.

A representative technology of the non-solder flip chip is a flip chip technology using an anisotropic conductive film (ACA). The flip chip technology using the existing ACA includes a process in which an ACA material is applied or temporarily bonded to substrates and the chips and the substrates are aligned, and heat and pressure are finally applied thereto to complete the flip chip package. However, the process has a long process time in forming a film or applying or temporarily bonding the ACA material to each substrate.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a through silicon via (TSV) for 3D packaging of a semiconductor device and a method for manufacturing the same having advantages of easily aligning chips with high precision of submicrons or less as compared with the related art when self-aligning the substrates, bonding the semiconductor dies (or semiconductor chips) at a low temperature by using plasma, improving production process efficiency, having very high electrical conductivity, and minimizing electrical signal delay.

Further, the present invention has been made in an effort to provide a through silicon via (TSV) for 3D packaging of a semiconductor device and a method for manufacturing the same that are capable of simplifying production processes, improving productivity, and having uniform quality by sequentially bonding a plurality of semiconductor dies (semiconductor chips).

An exemplary embodiment of the present invention provides a method for manufacturing a through silicon via (TSV) including: preparing a substrate having a metal thin film formed in a predetermined region of the substrate; preparing a semiconductor die (or semiconductor chip) having an insulation layer formed on a side of the semiconductor die (or semiconductor chip) formed with a via hole and formed with a through via hole by back grinding the other side of the semiconductor die (or semiconductor chip); aligning the substrate formed with the metal thin film and the semiconductor die (or semiconductor chip) formed with the insulation layer; forming a seed layer on one side including the via hole of the aligned semiconductor die (or semiconductor chip); and forming an electroplating layer on a top portion of the seed layer by using electroplating, including the inside of the via hole.

During the preparation of the substrate, an oxide bonding layer having the metal thin film provided therein may be further formed, and removing a predetermined region of the oxide bonding layer on the top portion of the metal thin film may be performed.

In addition, the oxide bonding layer may be formed using a chemical vapor deposition tetraethylortho silicate (CVD TEOS) process or a spin on glass (SOG) process.

The removing of the oxide bonding layer may be performed by etching or chemical-mechanical polishing (CMP).

The aligning may include spraying moisture or appling water drop to a bonding surface between the semiconductor die (or semiconductor chip) and the substrate to form a wetting layer, and then contacting the semiconductor die (or semiconductor chip) to the substrate to be self-aligned.

The preparing of the semiconductor die (or semiconductor chip) may include first surface treatment of the bonding surface of the semiconductor die (or semiconductor chip) so that the bonding surface has a hydrophilic surface, and the preparing of the substrate may include second surface treatment of the bonding surface of the substrate so that the bonding surface has a hydrophilic surface, prior to forming the metal thin film.

Further, the first surface treatment and the second surface treatment may be plasma treatments.

After the electroplating, a plurality of semiconductor dies (or semiconductor chips) may be stacked by repeatedly performing the removing of the electroplating layer other than at a predetermined area communicating with the via hole and the preparing of the semiconductor dies (or semiconductor chip) for the electroplating.

In this case, the metal thin film may be any one selected from Cu, Ag, Au, Pt, and Al, the seed layer may be Cu, and the electroplating layer may be any one selected from Cu, W, and Al.

The through silicon via (TSV) according to the exemplary embodiment of the present invention is manufactured according to the above-mentioned manufacturing method.

According to the exemplary embodiments of the present invention, the through silicon via (TSV) for 3D packaging of a semiconductor device and the method for manufacturing the same can easily align the chips with high precision of submicrons or less as compared with the related art when self-aligning the substrates, bond the substrates at a low temperature by using plasma, improve the production process efficiency, form very high electrical conductivity, and minimize electrical signal delay.

Further, according to the exemplary embodiments of the present invention, the through silicon via (TSV) for 3D packaging of a semiconductor device and the method for manufacturing the same can simplify the production processes, improve the productivity, and have uniform quality by sequentially bonding the plurality of semiconductor dies (or semiconductor chips).

DETAILED DESCRIPTION OF THE EMBODIMENTS

In general, the through silicon via (TSV), which is a package scheme of forming an electrode by punching a silicon wafer, has been in the limelight as a 3D packaging technology that can remarkably reduce power consumption while preventing high-frequency signal loss and seldom causes a signal delay in order to meet compactness, high speed, and low power performance objectives.

The through silicon via (TSV) is manufactured by a technology of filling via holes formed on separate silicon wafers (or chips) and then stacking the plurality of wafers (or chips) with the via holes filled.

Since the wafers with the filled via holes should be provided with bump layers for electrically connecting the wafers with each other, the manufacturing process is difficult and therefore the productivity is degraded.

Generally, when a via hole is filled by Cu electroplating, the bump layer includes a first bump layer using Cu on the top portion of the Cu layer, and a second bump layer using Sn formed on the top portion of the first bump layer.

In more detail, the method for manufacturing the through silicon via according to a conventional methode individually fills the via holes in each wafer and then stacks the wafers so that the portions where the via holes are formed correspond to each other. In this case, separate bump layers that are mechanically and electrically bonded are formed, such that the process is difficult and expensive.

Further, there is a problem in that when the plurality of wafers are stacked and bonded, each wafer essentially requires a carrier wafer, and after the bonding, a process of removing the carrier wafer is needed.

Before detailed content for implementing the present invention is described, a configuration that does not directly relate to the technical gist of the present invention is omitted in the range that deranges the technical gist of the present invention.

In addition, terms or words that are used in the present specification and claims should be understood as meanings and concepts that correspond to the technical spirit of the present invention in consideration of the principle that the concept of the term can be appropriately defined in order to describe the invention by using the best method by the inventor.

A through silicon via (TSV) 1000 for 3D packaging of a semiconductor device according to exemplary embodiments of the present invention having the above-mentioned characteristics and a method for manufacturing the same will now be described with reference to the accompanying drawings.

Figure 1:
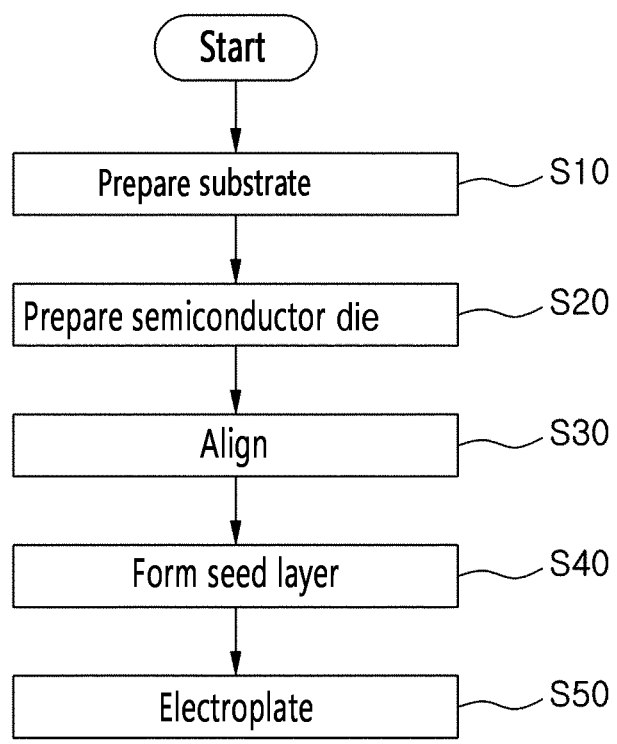
FIG. 1 is a flowchart showing a method for manufacturing a through silicon via (TSV) according to an exemplary embodiment of the present invention.

The method for manufacturing a through silicon via (TSV) 1000 for 3D packaging of a semiconductor device according to the exemplary embodiments of the present invention includes preparing a substrate 100 (S10), preparing a semiconductor die (or semiconductor chip) 200 (S20), aligning (S30), forming a seed layer 310 (S40), and electroplating (S50). (See FIG. 1)

First, the preparing of the substrate 100 (S10) is a step of forming a metal thin film 110 in a predetermined region of the substrate 100 having a plate shape and that is bonded to the semiconductor die (or semiconductor chip) 200.

Thereafter, when the electroplating (S50) is completed, the metal thin film 110 has a structure that conducts the substrate 100 to the semiconductor die (or semiconductor chip) 200 and mechanically couples them.

Figure 2:
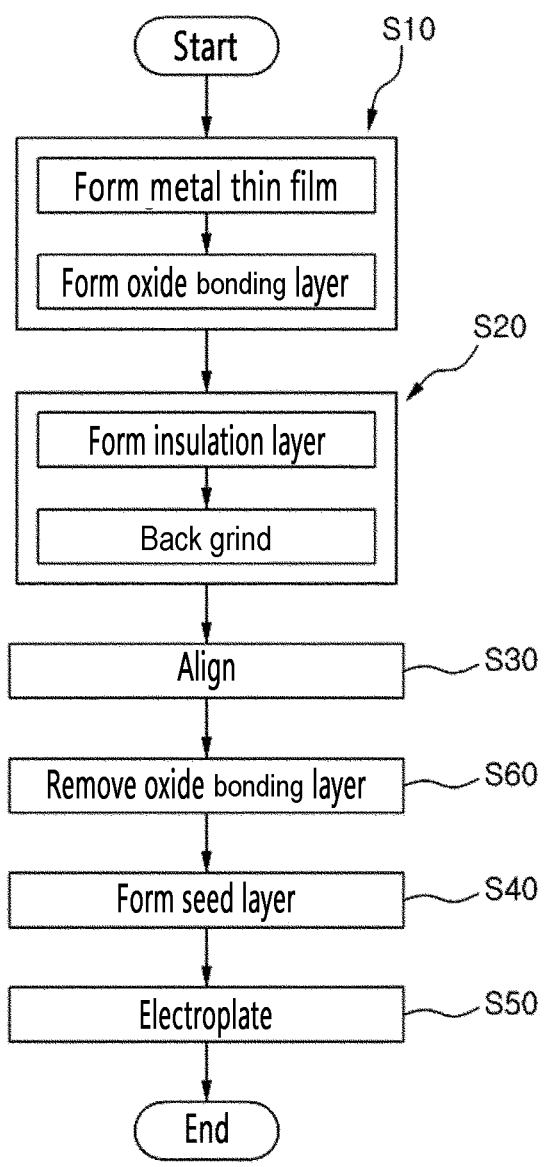
FIG. 2 is a flowchart showing a method for preparing a substrate and preparing a semiconductor die (or semiconductor chip) according to an exemplary embodiment of the present invention.
Figure 3:
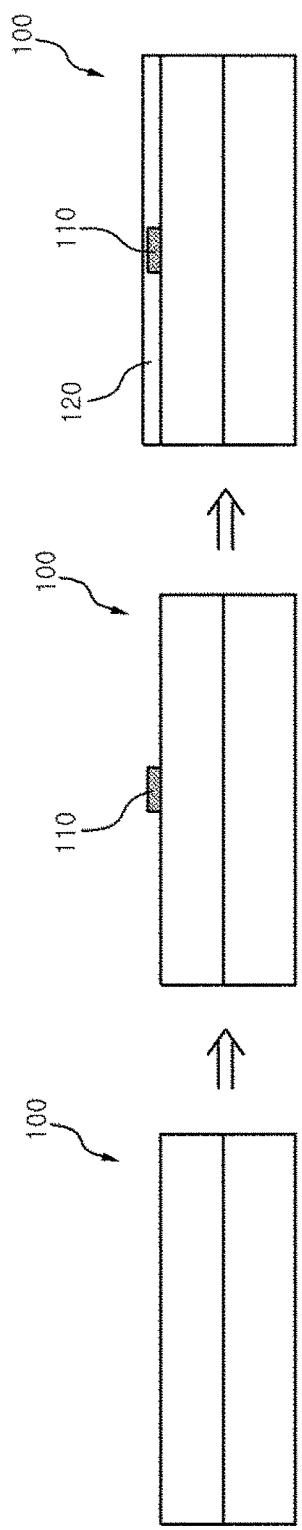
FIG. 3 is a diagram for illustrating the preparation of the substrate in the method for manufacturing a through silicon via (TSV) according to an exemplary embodiment of the present invention.

Referring to FIGS. 2 and 3, the method for manufacturing a through silicon via (TSV) 1000 according to the exemplary embodiment of the present invention may further form an oxide bonding layer 120 on one side of the substrate 100 formed with the metal thin film 110, wherein the oxide bonding layer 120 has the metal thin film 110 formed therein.

The oxide bonding layer 120 has a structure that may increase adhesion between the substrate 100 and the semiconductor die (or semiconductor chip) 200 while preventing insulation and metal materials from being diffused, and may be formed by using a chemical vapor deposition tetraethylorthosilicate (CVD TEOS) process or a spin on glass (SOG) method.

In more detail, as the CVD TEOS process, plasma enhanced CVD (PECVD), high density plasma CVD (HDP CVD), or sub-atmospheric CVD (SACVD) may be performed.

Thereafter, in order to contact a seed layer 310 to the metal thin film 100, the forming of the seed layer 310 (S40) and the removing of the oxide bonding layer 120 (S60) in the region in which the metal thin film 110 is formed are performed prior to the electroplating (for example, between the aligning (S30) and the forming of the seed layer 310 (S40)).

The removing of the oxide bonding layer 120 (S60) may be performed by etching or chemical-mechanical polishing.

In FIG. 2, the removing of the oxide bonding layer 120 (S60) is performed between the aligning (S30) and the forming (S40) of the seed layer 310, but is a preferred step in the case where the etching is used.

The method for manufacturing a through silicon via (TSV) 1000 according to the exemplary embodiment of the present invention includes each step described above, but is not limited to the order shown in the drawings. Therefore, when the removing (S60) of the oxide bonding layer 120 is performed by the chemical-mechanical polishing, it is first performed prior to the aligning (S30), and then the aligning (S30), the forming of the seed layer 130 (S40), and the electroplating (S50) may be performed.

FIG. 3 shows an example of the preparing the substrate 100 (S10). The metal thin film 110 is formed in a predetermined region on one side of the substrate 100 having a plate shape, and the oxide bonding layer 120 is formed to include the metal thin film 100 therein.

Figure 4:
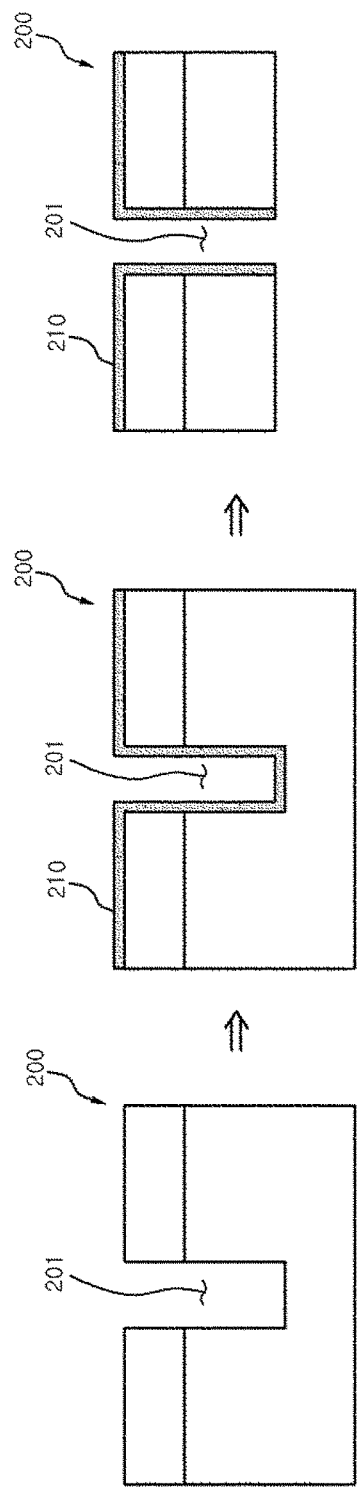
FIG. 4 is a diagram for illustrating the preparation of the semiconductor die (or semiconductor chip) of the method for manufacturing a through silicon via (TSV) according to an exemplary embodiment of the present invention.

Referring to FIGS. 2 and 4, the preparing of the semiconductor die (or semiconductor chip) 200 (S20) is a step of forming an insulation layer 210 on a side (the other side that does not contact the substrate 100) communicating with a via hole 201, including the via hole 201 of the semiconductor die (or semiconductor chip) 200 formed with the via hole 201 and preparing the semiconductor die (or semiconductor chip) 200 through which the via hole 20 penetrates by back grinding the other side on which the insulation layer 210 is not formed (see FIGS. 2 and 4).

The aligning (S30), which is a step of aligning the substrate 100 and the semiconductor die (or semiconductor chip) 200 prepared through the preparing of the substrate 100 (S10) and the preparing of the semiconductor die (or semiconductor chip) 200 (S20), aligns the substrate 100 formed with the metal thin film 110 and the other side of the semiconductor die (or semiconductor chip) 200 formed with the insulation layer 210 to contact each other.

In this case, the aligning (S30) may be self-alignment.

The self-alignment step includes spraying moisture or applying water drop 410 to one side of surfaces contacting each other to form a wetting layer 420 and then contacts them. In this case, the contact surface of the semiconductor die (or semiconductor chip) 200 and the substrate 100 may be subjected to the surface treatment to have a hydrophilic surface during the preparing (S20) of the semiconductor die (or semiconductor chip) 200 or the preparing (S10) of the substrate 100.

Figure 8:
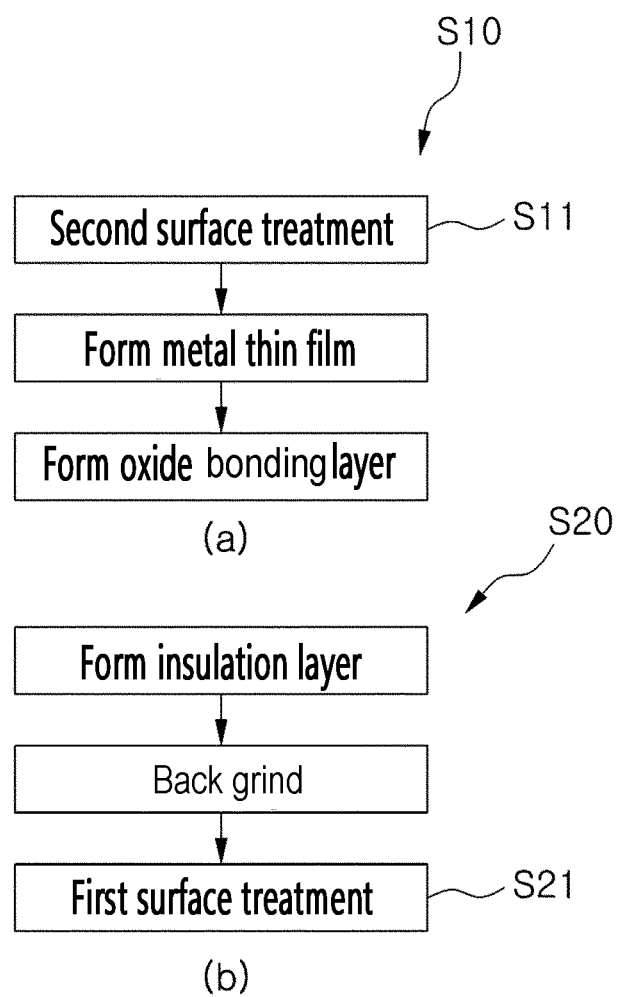
FIG. 8 is a flowchart showing a method for preparing the substrate and preparing the semiconductor die (or semiconductor chip) including surface treatments according to an exemplary embodiment of the present invention.

First, (a) of FIG. 8 shows an example of performing second surface treatment on one side of the substrate 100 (S11), and then forming the metal thin film 110.

The second surface treatment (S11) may be preformed by plasma-treating one side of the substrate 100, and may lower the bonding temperature between the substrate 100 and the semiconductor die (or semiconductor chip) 200 due to the oxide bonding layer 120.

That is, the atmosphere and vacuum plasma treatment may increase the hydrophilicity and may improve the adhesion by lowering the bonding temperature.

In FIG. 8, (b) shows the case where the first surface treatment (S21) of the semiconductor die (or semiconductor chip) 200 formed with the through via hole 201 is performed.

By performing the surface treatment as shown in FIG. 8 (a) and (b), the method of manufacturing a through silicon via (TSV) 1000 according to the present invention may lower the temperature condition required at the aligning (S30), thereby making it possible to manufacture the through silicon via (TSV) 1000 by a simpler method.

Figure 9:
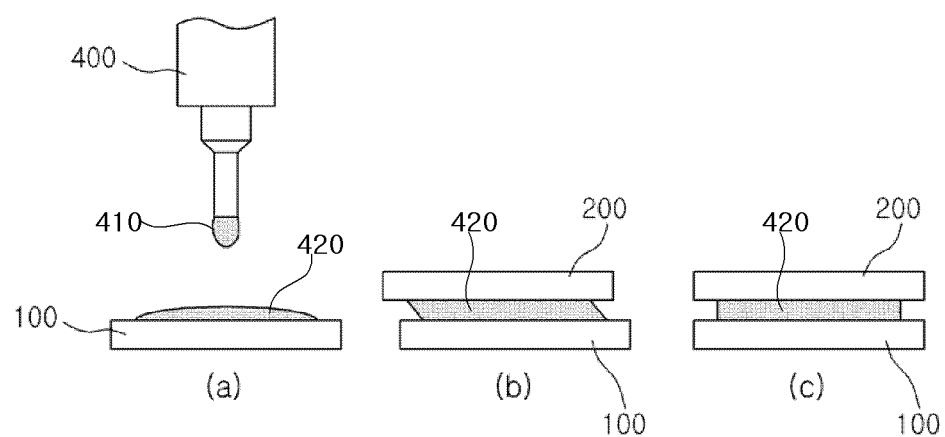
FIG. 9 is a diagram showing the aligning in the method for manufacturing a through silicon via (TSV) according to an exemplary embodiment of the present invention.

FIG. 9 is a diagram for illustrating the self-alignment. When spraying moisture or applying water drop 410 to form the wetting layer 420 as shown in (a) of FIG. 9 and contacting the substrate 100 to the semiconductor die (or semiconductor chip) 200 as shown in (b) FIG. 9, the metal thin film 100 of the substrate 100 and the via hole 201 of the semiconductor die (or semiconductor chip) 200 are self-aligned in a stacking direction to exist at the same position in a vertical direction, as shown in (c) of FIG. 9. In FIG. 9, a unit for spraying moisture or applying water drop 410 is denoted by reference numeral 400.

Through this, the method for manufacturing a through silicon via (TSV) 1000 according to the exemplary embodiment of the present invention self-aligns the semiconductor die (or semiconductor chip) by moving the semiconductor die (or semiconductor chip) 200 in a direction for reducing surface energy, having the wetting layer 420 between the semiconductor die (or semiconductor chip) 200 and the substrate 100, thereby making it possible to achieve the alignment at a higher speed as compared to the case of using a separate alignment device.

Figure 5:
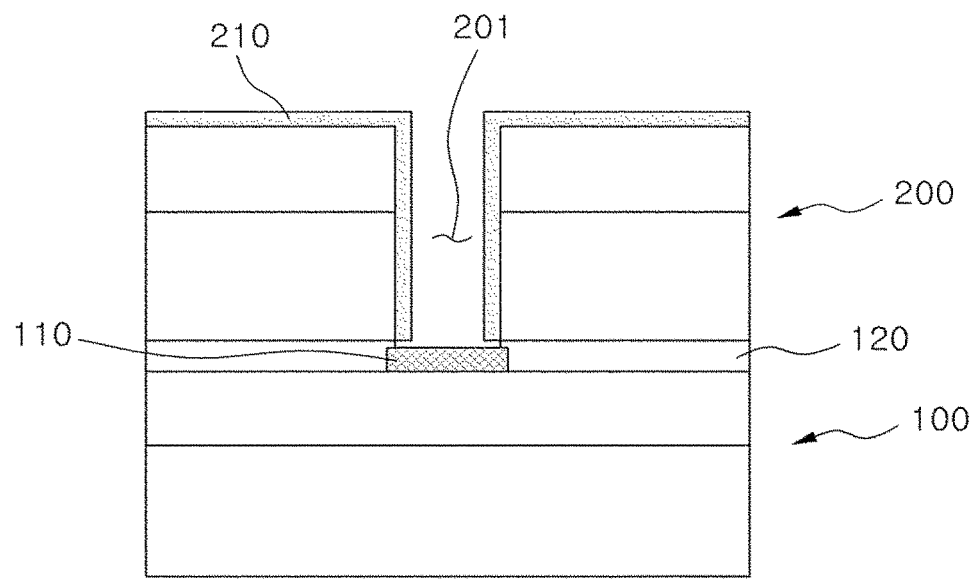
FIGS. 5 to 7 are diagrams for illustrating aligning to electroplating of the method for manufacturing a through silicon via (TSV) according to an exemplary embodiment of the present invention.

FIG. 5 shows a state where the oxide bonding layer 120 of a portion formed with the metal thin film 110 is removed after the substrate 100 and the semiconductor die (or semiconductor chip) 200 are aligned through the aligning (S30).

Figure 6:
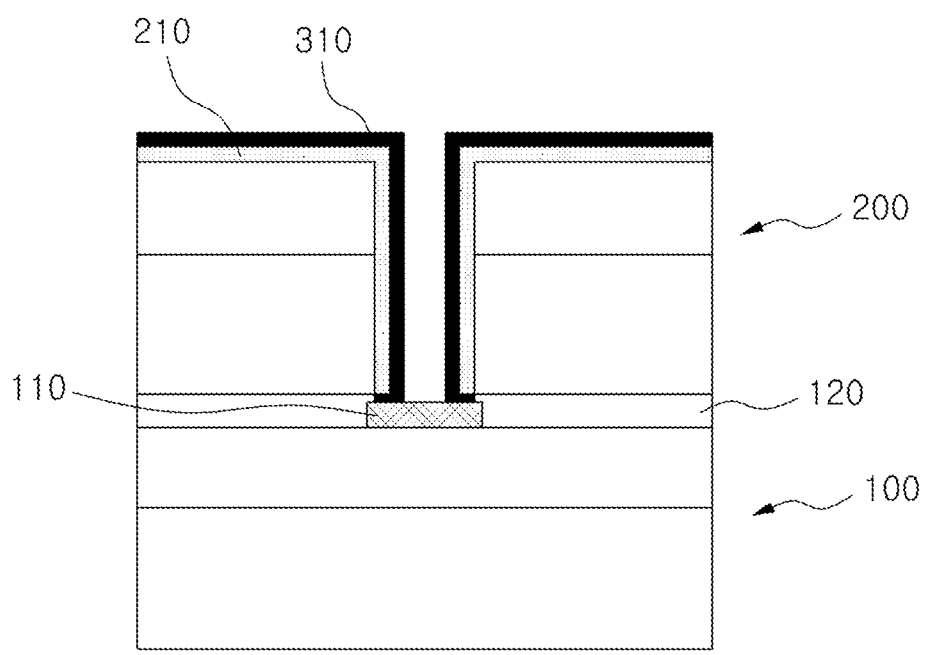

The forming of the seed layer 310 (S40) is a step of forming the metal thin film 110 of the substrate 100 and the seed layer 310 on the top portion of the semiconductor die (or semiconductor chip) 200 and in the region where the via hole 201 is formed, as shown in FIG. 6.

The forming of the seed layer 310 (S40) may be performed by using deposition, and may be performed by, for example, sputtering.

Figure 7:
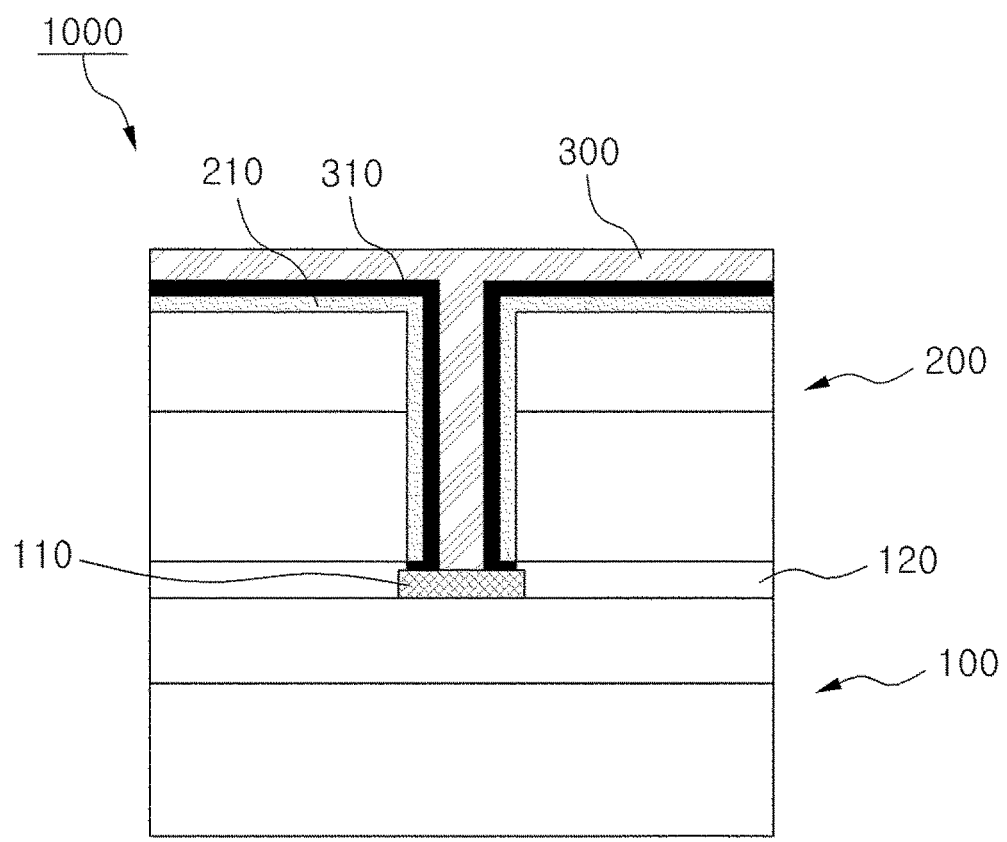

The electroplating (S50) is a step of forming an electroplating layer 300 on the top portion of the seed layer 310, including the inside of the via hole 201, by using the electroplating, which is shown in FIG. 7.

FIG. 7 shows an example where a single semiconductor die (or semiconductor chip) 200 is connected to one side of the substrate 100.

The through silicon via (TSV) 1000 for 3D packaging of a semiconductor device according to the exemplary embodiment of the present invention may be connected to a plurality of semiconductor dies (or semiconductor chips) 200 as well as having a shape shown in FIG. 7.

Figure 10:
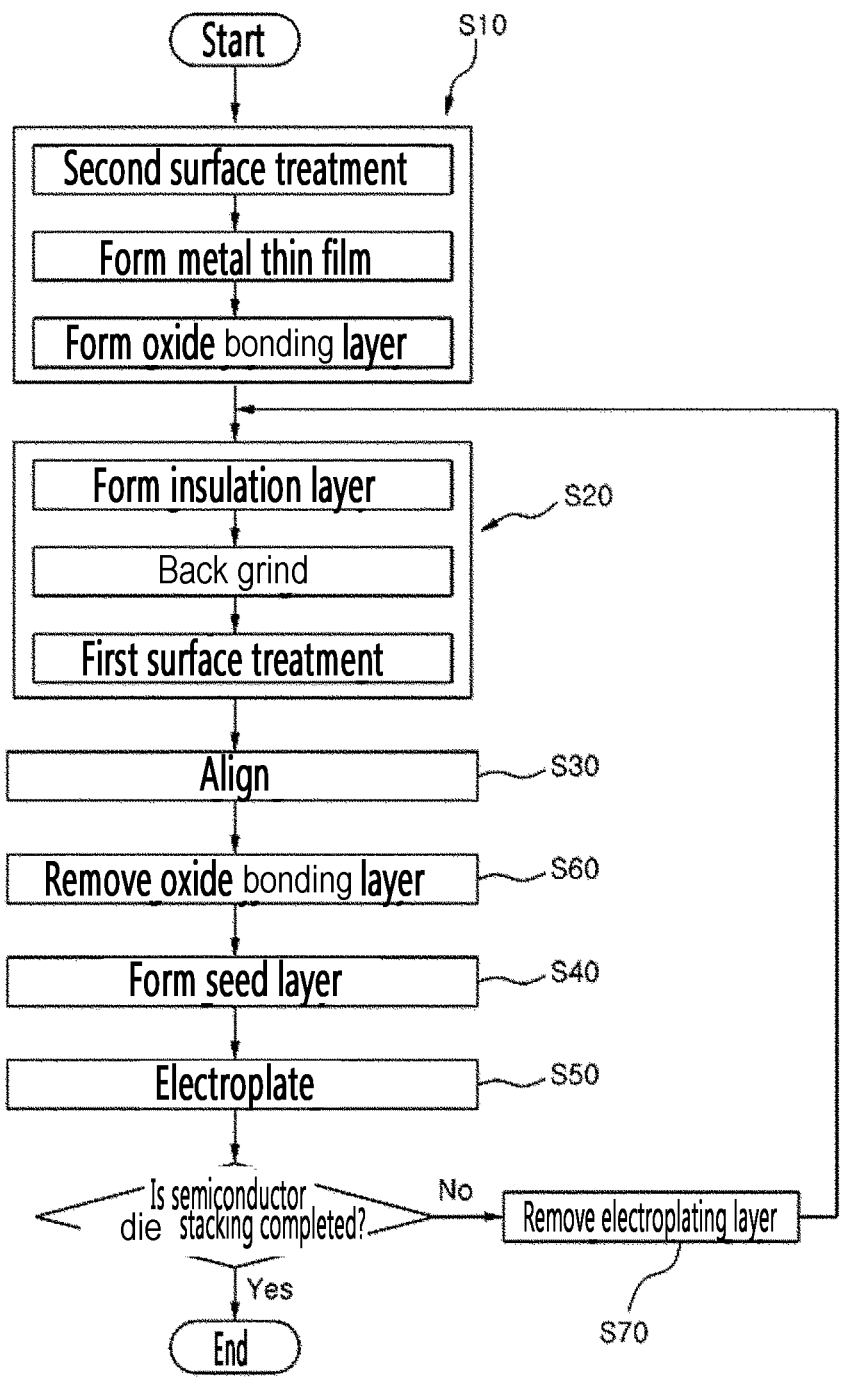
FIG. 10 is a flowchart showing a method for manufacturing a through silicon via (TSV) according to another exemplary embodiment of the present invention.

Referring to FIG. 10, when additionally connecting another semiconductor die (or semiconductor chip) 200 after performing the connection step of the single semiconductor die (or semiconductor chip) 200, the removing of the electroplating layer 300 (S70) other than at the predetermined region (communicating with the via hole 201) of the electroplating layer 300 performed through the previous step (electroplating step (S50)) is performed.

Figure 11:
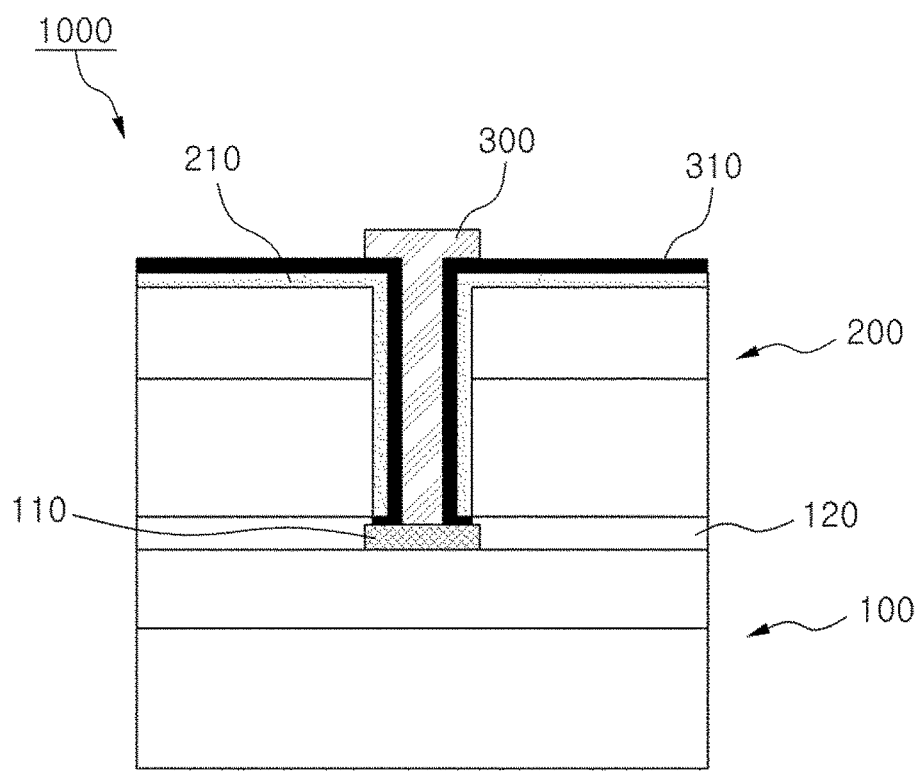
FIG. 11 is a diagram showing controlling an electroplating layer in the method for manufacturing a through silicon via (TSV) according to another exemplary embodiment of the present invention.

FIG. 11 shows the state in which the removing of the electroplating layer 300 (S70) is completed.

In addition, after the removing of the electroplating layer 300 (S70), the contacting of the semiconductor die (or semiconductor chip) 200 (S20) to the electroplating (S50) are performed, such that the one-layer semiconductor die (or semiconductor chip) 200 may be coupled to be stacked.

That is, the substrate 100, which is a component required for supporting the first semiconductor die (or semiconductor chip) 200, contacts the semiconductor die (or semiconductor chip) 200 to the top portion of the semiconductor die (or semiconductor chip) 200 from the stacking of the next semiconductor die (or semiconductor chip) 200.

Through this, the method for manufacturing a through silicon via (TSV) 1000 according to the exemplary embodiment of the present invention may form the through silicon via (TSV) 1000 having the multi-layer semiconductor die (or semiconductor chip) 200 in a build-up scheme of connecting the semiconductor die (or semiconductor chip) 200 through the electroplating after aligning the semiconductor die (or semiconductor chip) 200 in a multi-stage scheme.

Figure 12:
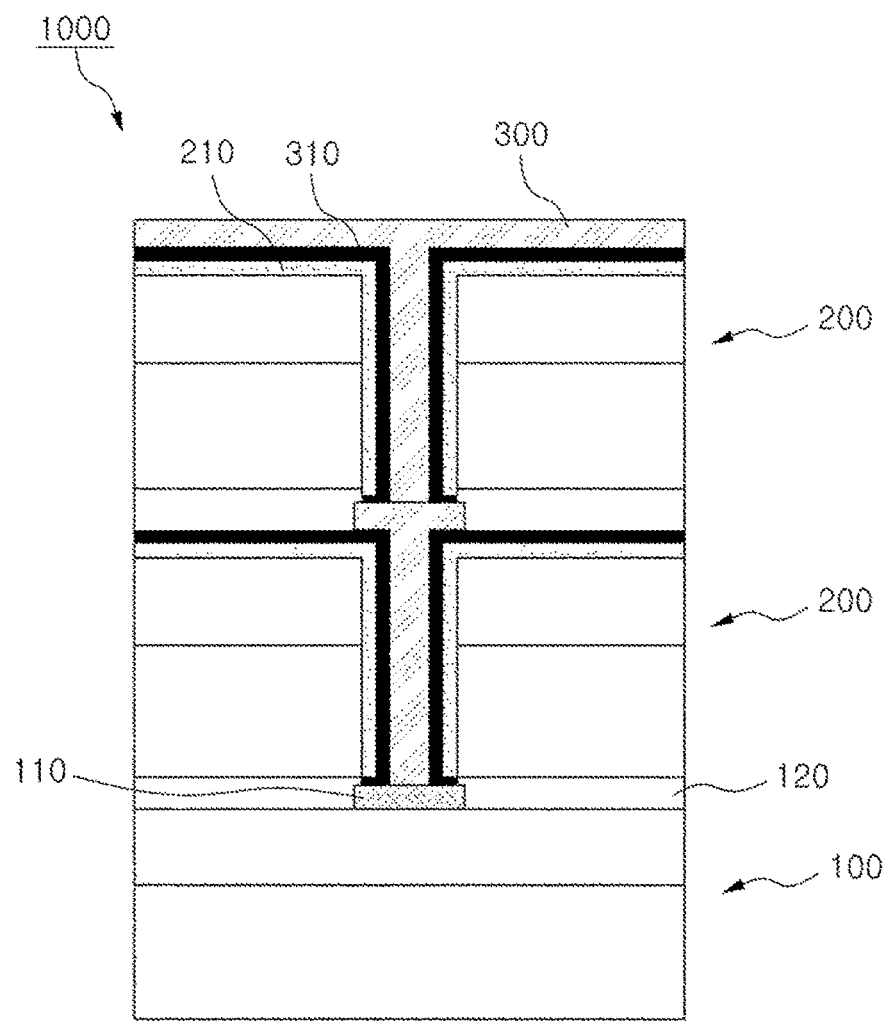
FIG. 12 is a diagram showing the through silicon via (TSV) including a plurality of semiconductor dies (or semiconductor chips) stacked by the method according to another exemplary embodiment of the present invention.

FIG. 12 shows an example where two semiconductor dies (or semiconductor chips) 200 are formed on the top portion of the substrate 100, but the exemplary embodiment of the present invention is not limited thereto. At least three semiconductor dies (or semiconductor chips) 200 may be formed to be stacked.

As described above, even though the method for manufacturing a through silicon via (TSV) 1000 according to the exemplary embodiment of the present invention aligns the multi-layer semiconductor die (or semiconductor chip) 200, the semiconductor die (or semiconductor chip) 200 is separately connected by the build-up scheme, thereby making it possible to prevent the electrical connection and the mechanical adhesion from being degraded.

In addition, the method for manufacturing a through hole 1000 according to the exemplary embodiment of the present invention does not require the carrier wafer that should be provided for each semiconductor die (or semiconductor chip) 200 as compared with the method of aligning the semiconductor die (or semiconductor chip) 200 filled with the via hole 201 according to the conventional method, thereby making it possible to simplify the production processes, perform the alignment at a higher speed by using the self-alignment to increase the productivity, and produce the through silicon via (TSV) 1000 at a low cost in a short time.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a through silicon via (TSV), comprising:

preparing a substrate having a metal thin film formed in a predetermined region of the substrate;

preparing a semiconductor die (or semiconductor chip) having an insulation layer formed on a side of the semiconductor die (or semiconductor chip) formed with a via hole and formed with a through via hole by back grinding the other side of the semiconductor die (or semiconductor chip);

aligning the substrate formed with the metal thin film and the semiconductor die (or semiconductor chip) formed with the insulation layer;

forming a seed layer on one side including the via hole of the aligned semiconductor die (or semiconductor chip) wherein the seed layer is in direct contact with the metal thin film; and forming an electroplating layer on a top portion of the seed layer by using electroplating, including the inside of the via hole, wherein the preparing of the semiconductor die (or semiconductor chip) includes first surface treatment of a bonding surface of the semiconductor die (or semiconductor chip) formed with the through via hole such that the bonding surface of the semiconductor die (or semiconductor chip) has a hydrophilic surface, wherein the preparing of the substrate includes second surface treatment of a bonding surface of the substrate, and wherein the aligning includes spraying moisture or applying water drop to at least the bonding surface of the semiconductor die (or semiconductor chip) or the bonding surface of the substrate to form a wetting layer between the semiconductor die (or semiconductor chip) and the substrate, and then contacting the semiconductor die (or semiconductor chip) to the substrate to be self-aligned.

2. The method of claim 1, wherein the preparation of the substrate further comprises forming an oxide bonding layer having the metal thin film provided therein, and removing a predetermined region of the oxide bonding layer on the top portion of the metal thin film is performed.

3. The method of claim 2, wherein the oxide bonding layer 120 is formed by using a chemical vapor deposition tetraethylorthosilicate (CVD TEOS) process or a spin on glass (SOG) process, and the removing of the oxide bonding layer is performed by etching or chemical-mechanical polishing (CMP).

4. The method of claim 1, wherein the first surface treatment and the second surface treatment are plasma treatments.

5. The method of claim 1, wherein the plurality of semiconductor dies (or semiconductor chips) are stacked by repeatedly performing the removing of the electroplating layer other than at a predetermined area communicating with the via hole and the preparing of the semiconductor die (or semiconductor chip) for the electroplating.

6. The method of claim 1, wherein the metal thin film is any one selected from Cu, Ag, Au, Pt, and Al.

7. The method of claim 1, wherein the seed layer is Cu.

8. The method of claim 1, wherein the electroplating layer is any one selected from Cu, W, and Al.

9. A through silicon via (TSV) manufactured by a manufacturing method claimed in claim 1.

* * * * *